(12) United States Patent
Liu et al.

(10) Patent No.: US 10,711,817 B2
(45) Date of Patent: Jul. 14, 2020

(54) ROD FOR USE IN RACK AND HOLDING DEVICE FOR USE IN COOPERATION WITH RACK

(71) Applicant: EMC IP Holding Company LLC, Hopkinton, MA (US)

(72) Inventors: Alice Aiqin Liu, Shanghai (CN); Haifang Zhai, Shanghai (CN); Jing Chen, Epping (AU); Qingqiang Guo, Shanghai (CN); Jacky Jianguo Pang, Shanghai (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 15/622,318

(22) Filed: Jun. 14, 2017

(65) Prior Publication Data

US 2017/0356482 A1 Dec. 14, 2017

(30) Foreign Application Priority Data

Jun. 14, 2016 (CN) .......................... 2016 1 0422872

(51) Int. Cl.
| | |
|---|---|
| *F16B 12/14* | (2006.01) |
| *A47B 96/14* | (2006.01) |
| *F16B 12/10* | (2006.01) |
| *H05K 7/14* | (2006.01) |

(52) U.S. Cl.
CPC .......... *F16B 12/14* (2013.01); *A47B 96/1441* (2013.01); *F16B 2012/106* (2013.01); *H05K 7/1488* (2013.01)

(58) Field of Classification Search
CPC .... F16B 12/14; F16B 2012/106; F16B 33/02; H05K 7/1488; Y10T 403/75
USPC ........ 211/26; 312/332.1; 403/408.1; 411/423
See application file for complete search history.

(56) References Cited

U.S. PATENT DOCUMENTS

| | | | | |
|---|---|---|---|---|
| 1,497,952 | A * | 6/1924 | Smith .................. | H02G 3/0616 156/294 |
| 1,909,489 | A * | 5/1933 | Eaton ...................... | F16B 33/02 285/390 |
| 2,145,168 | A * | 1/1939 | Flagg .................... | E21B 17/042 228/135 |
| 2,514,589 | A * | 7/1950 | Penman .................. | F16B 33/02 411/423 |
| 2,775,281 | A * | 12/1956 | Smith ..................... | F16B 37/12 411/301 |
| 2,788,047 | A * | 4/1957 | Rapata .................. | F16B 37/041 411/182 |

(Continued)

FOREIGN PATENT DOCUMENTS

| | | | |
|---|---|---|---|
| CN | 201201218 Y | * | 3/2009 |
| CN | 201521528 | | 7/2010 |

(Continued)

*Primary Examiner* — Jonathan Liu
*Assistant Examiner* — Devin K Barnett
(74) *Attorney, Agent, or Firm* — BainwoodHuang (57) ABSTRACT

Embodiments of the present disclosure provide a rod for use in a rack and a holding device for use in cooperation with the rack. The rod comprises: a first end provided with a bolt, the bolt having a trapezoidal thread, wherein when the rod is inserted into the rack through a target device, the bolt connects the first end to the rack such that the target device is secured to the rack.

9 Claims, 6 Drawing Sheets

(56) References Cited

U.S. PATENT DOCUMENTS

| | | | | |
|---|---|---|---|---|
| 2,788,829 A * | 4/1957 | Edwards | ............... | F16B 37/005 |
| | | | | 30/270 |
| 2,815,997 A * | 12/1957 | Korb | ............... | F16B 12/14 |
| | | | | 403/52 |
| 2,836,215 A * | 5/1958 | Rapata | ............... | F16B 12/30 |
| | | | | 174/158 R |
| 3,233,932 A * | 2/1966 | Utterback | ............... | E05C 1/04 |
| | | | | 292/175 |
| 3,250,559 A * | 5/1966 | Sommerfeld | ......... | F16B 5/0208 |
| | | | | 29/512 |
| 3,286,578 A * | 11/1966 | Fiddler | ............... | F16B 5/128 |
| | | | | 24/291 |
| 3,343,581 A * | 9/1967 | Martin | ............... | F16B 5/0208 |
| | | | | 292/251 |
| 3,418,013 A * | 12/1968 | Kelly | ............... | F16B 33/02 |
| | | | | 403/22 |
| 3,652,177 A * | 3/1972 | Loebel | ............... | F01D 17/162 |
| | | | | 415/110 |
| 3,820,477 A * | 6/1974 | Griffin | ............... | A47B 1/04 |
| | | | | 108/64 |
| 3,918,201 A * | 11/1975 | Graziano | ............... | E05F 15/655 |
| | | | | 49/28 |
| 4,762,450 A * | 8/1988 | Schwind | ............... | F16B 13/061 |
| | | | | 411/187 |
| 4,883,399 A * | 11/1989 | MacLean | ............... | F16B 33/006 |
| | | | | 411/431 |
| 4,929,184 A * | 5/1990 | Emadi | ............... | H01R 13/6453 |
| | | | | 439/362 |
| 5,020,949 A * | 6/1991 | Davidson | ............... | F16B 31/02 |
| | | | | 411/11 |
| 5,052,871 A * | 10/1991 | Collins | ............... | E02D 17/083 |
| | | | | 411/423 |
| 5,162,000 A * | 11/1992 | Frantz | ............... | H01R 13/5045 |
| | | | | 439/607.58 |
| 5,197,900 A * | 3/1993 | Ellis | ............... | H01R 13/6215 |
| | | | | 439/350 |
| 5,252,015 A * | 10/1993 | Davis | ............... | F16B 31/00 |
| | | | | 411/231 |
| 5,342,216 A * | 8/1994 | Davis | ............... | H01R 13/6581 |
| | | | | 439/362 |
| 5,350,266 A * | 9/1994 | Espey | ............... | B62J 23/00 |
| | | | | 403/375 |
| 5,451,102 A * | 9/1995 | Chuan | ............... | F16B 12/14 |
| | | | | 312/257.1 |
| 5,511,438 A * | 4/1996 | Aki | ............... | F16H 25/2009 |
| | | | | 74/441 |
| 5,579,204 A | 11/1996 | Nelson et al. | | |
| 5,665,937 A | 9/1997 | Tirrell | | |
| 5,779,411 A * | 7/1998 | Vasseur | ............... | F16B 37/043 |
| | | | | 411/182 |
| 5,859,766 A * | 1/1999 | Van Scyoc | ......... | H01R 13/6215 |
| | | | | 361/737 |
| 5,920,459 A * | 7/1999 | Weber | ............... | H01R 13/6215 |
| | | | | 361/752 |
| 6,299,223 B1 * | 10/2001 | Ji | ............... | E05C 5/02 |
| | | | | 292/175 |
| 6,343,957 B1 * | 2/2002 | Kuo | ............... | H01R 31/06 |
| | | | | 439/362 |
| 6,356,441 B1 | 3/2002 | Claprood | | |
| 6,392,872 B1 | 5/2002 | Doustou, III et al. | | |
| 6,398,324 B1 | 6/2002 | Claprood | | |
| 6,435,903 B1 * | 8/2002 | Nelson | ............... | H01R 13/71 |
| | | | | 174/57 |
| 6,515,854 B1 | 2/2003 | Claprood | | |
| 6,615,315 B1 | 9/2003 | Mulvey et al. | | |
| 6,655,720 B2 * | 12/2003 | Rampen | ............... | E05B 65/0876 |
| | | | | 292/163 |
| 6,695,149 B1 | 2/2004 | Cote et al. | | |
| 6,821,140 B2 * | 11/2004 | Wu | ............... | H01R 13/6215 |
| | | | | 439/362 |
| 6,826,057 B1 | 11/2004 | Gundogan et al. | | |
| 6,850,410 B2 | 2/2005 | Peeke et al. | | |
| 6,866,533 B2 * | 3/2005 | Wu | ............... | H01R 13/6335 |
| | | | | 439/352 |
| 7,033,202 B2 * | 4/2006 | Wu | ............... | H01R 13/6215 |
| | | | | 439/362 |
| 7,121,857 B1 | 10/2006 | Lewis | | |
| 7,349,226 B2 * | 3/2008 | Ice | ............... | H05K 7/1404 |
| | | | | 361/796 |
| 7,405,942 B1 | 7/2008 | Lewis | | |
| 7,457,134 B2 * | 11/2008 | Ice | ............... | H05K 7/1404 |
| | | | | 361/800 |
| 7,710,734 B2 * | 5/2010 | Ice | ............... | G02B 6/4201 |
| | | | | 361/702 |
| 7,722,359 B1 | 5/2010 | Frangioso, Jr. et al. | | |
| 7,859,849 B2 * | 12/2010 | Ice | ............... | H05K 7/20418 |
| | | | | 361/704 |
| 8,199,494 B2 * | 6/2012 | Nguyen | ............... | H05K 7/1428 |
| | | | | 312/223.1 |
| 8,593,827 B1 | 11/2013 | Lewis et al. | | |
| 8,747,132 B1 | 6/2014 | Feroli et al. | | |
| 8,764,468 B1 | 7/2014 | Feroli et al. | | |
| 8,926,479 B2 * | 1/2015 | Chen | ............... | A63B 22/02 |
| | | | | 292/137 |
| 9,155,194 B1 | 10/2015 | Sullivan et al. | | |
| 9,357,666 B1 | 5/2016 | Felton et al. | | |
| 9,506,491 B1 * | 11/2016 | Lewis | ............... | G06F 1/183 |
| D779,046 S * | 2/2017 | Tansey, Jr. | ............... | D23/262 |
| 9,711,888 B2 * | 7/2017 | Sawabe | ............... | H01R 13/512 |
| 9,827,160 B2 * | 11/2017 | Chou | ............... | A61H 1/0218 |
| 9,910,466 B1 | 3/2018 | Strickland et al. | | |
| 9,992,903 B1 | 6/2018 | Dufresne et al. | | |
| 10,031,196 B2 * | 7/2018 | Rabinovitz | ............... | G01R 33/28 |
| 10,031,561 B1 | 7/2018 | Strickland et al. | | |
| 10,149,402 B1 | 12/2018 | Dufresne et al. | | |
| 2003/0147716 A1 * | 8/2003 | Nagawa | ............... | F16B 35/041 |
| | | | | 411/288 |
| 2004/0022601 A1 * | 2/2004 | Meyer | ............... | F16B 33/06 |
| | | | | 411/378 |
| 2004/0048516 A1 * | 3/2004 | Mandrusov | ......... | H01R 13/6315 |
| | | | | 439/607.41 |
| 2004/0073218 A1 * | 4/2004 | Dahners | ............... | A61B 17/8057 |
| | | | | 606/287 |
| 2004/0156694 A1 * | 8/2004 | Behle | ............... | F16B 13/124 |
| | | | | 411/182 |
| 2005/0132538 A1 * | 6/2005 | Thomeczek | ............... | B25G 3/04 |
| | | | | 16/422 |
| 2006/0166558 A1 * | 7/2006 | Katoh | ............... | H01R 13/6583 |
| | | | | 439/607.41 |
| 2007/0071571 A1 * | 3/2007 | Zakrzewski | ............... | F16B 33/02 |
| | | | | 411/32 |
| 2007/0280803 A1 * | 12/2007 | Pritchard | ............... | F16B 33/02 |
| | | | | 411/411 |
| 2008/0298009 A1 * | 12/2008 | Weng | ............... | G06F 1/187 |
| | | | | 361/679.37 |
| 2009/0271950 A1 * | 11/2009 | Wang | ............... | E05B 1/0015 |
| | | | | 16/415 |
| 2011/0041522 A1 * | 2/2011 | Carrubba | ............... | F16K 1/308 |
| | | | | 62/77 |
| 2011/0314768 A1 * | 12/2011 | Johnson | ............... | B25B 13/065 |
| | | | | 52/745.21 |
| 2012/0080984 A1 * | 4/2012 | Watts | ............... | A47B 47/05 |
| | | | | 312/223.2 |
| 2012/0126673 A1 * | 5/2012 | Chen | ............... | H05K 7/20736 |
| | | | | 312/236 |
| 2012/0207573 A1 * | 8/2012 | McIntosh | ............... | H05K 7/1488 |
| | | | | 414/589 |
| 2013/0074279 A1 * | 3/2013 | Bridges | ............... | B25G 1/04 |
| | | | | 15/144.4 |
| 2013/0257037 A1 * | 10/2013 | Nashery | ............... | F16L 15/08 |
| | | | | 285/93 |
| 2013/0257247 A1 * | 10/2013 | Doll | ............... | B60R 7/04 |
| | | | | 312/319.7 |
| 2014/0140758 A1 * | 5/2014 | Liu | ............... | F16B 12/14 |
| | | | | 403/299 |
| 2014/0262335 A1 * | 9/2014 | Bull | ............... | E21B 17/00 |
| | | | | 166/379 |

(56) References Cited

U.S. PATENT DOCUMENTS

| | | | | |
|---|---|---|---|---|
| 2015/0000096 A1* | 1/2015 | Gilbreath | ................ | F16L 21/08 |
| | | | | 29/426.1 |
| 2015/0119945 A1* | 4/2015 | Sasing | ............... | A61B 17/7032 |
| | | | | 606/308 |
| 2015/0157339 A1* | 6/2015 | McGinley | .......... | A61B 17/1739 |
| | | | | 606/87 |
| 2015/0256394 A1* | 9/2015 | Palmer | .................... | H04L 12/10 |
| | | | | 709/221 |
| 2015/0257311 A1* | 9/2015 | Palmer | ............... | H05K 7/20836 |
| | | | | 700/276 |
| 2015/0260216 A1* | 9/2015 | Tseng | ..................... | F16B 39/02 |
| | | | | 411/103 |
| 2015/0314498 A1* | 11/2015 | Iwasaki | ................... | F16B 37/00 |
| | | | | 411/427 |
| 2016/0195121 A1* | 7/2016 | O'Brien | ................. | F16B 12/14 |
| | | | | 403/296 |
| 2016/0341230 A1* | 11/2016 | Chesser | ................ | A47B 13/04 |
| 2016/0377207 A1* | 12/2016 | Witkowski | ............. | E21B 17/04 |
| | | | | 285/386 |
| 2017/0027073 A1* | 1/2017 | Zani | ........................ | G06F 1/185 |
| 2017/0105313 A1* | 4/2017 | Shedd | ................ | H05K 7/20272 |
| 2017/0111451 A1* | 4/2017 | Thul | ...................... | H04L 67/125 |
| 2017/0122359 A1* | 5/2017 | Foerster, Jr. | .......... | F16B 37/127 |
| 2017/0261151 A1* | 9/2017 | Hsu | ........................ | F16B 33/02 |
| 2017/0268239 A1* | 9/2017 | Kobayashi | ........... | H05K 7/1497 |
| 2018/0070469 A1* | 3/2018 | Hofmann | ............. | H05K 7/1489 |
| 2018/0137894 A1* | 5/2018 | Kodama | ................ | G11B 33/02 |
| 2018/0163904 A1* | 6/2018 | Nguyen | .............. | F16L 19/0218 |
| 2018/0198247 A1* | 7/2018 | Klein | ................... | H01R 25/142 |
| 2018/0213673 A1* | 7/2018 | Eckberg | .................... | H05K 7/18 |
| 2018/0221965 A1* | 8/2018 | Vezzoli | ................. | B23B 31/107 |
| 2018/0231037 A1* | 8/2018 | Wu | ........................ | F16B 5/0208 |
| 2018/0266469 A1* | 9/2018 | You | ........................ | F16B 35/041 |
| 2018/0279777 A1* | 10/2018 | Huang | ................... | A47B 77/02 |

FOREIGN PATENT DOCUMENTS

| | | |
|---|---|---|
| CN | 102566695 | 7/2012 |
| JP | 09280229 A | * 10/1997 |

\* cited by examiner

ROD FOR USE IN RACK AND HOLDING DEVICE FOR USE IN COOPERATION WITH RACK

RELATED APPLICATIONS

This application claim priority from Chinese Patent Application Number CN201610422872.6, filed on Jun. 14, 2016 at the State Intellectual Property Office, China, titled "ROD FOR USE IN RACK AND HOLDING DEVICE FOR USE IN COOPERATION WITH RACK" the contents of which is herein incorporated by reference in its entirety.

FIELD

Embodiments of the present disclosure relate to a storage system, and more specifically to a rod for use in a rack and a holding device for use in cooperation with the rack.

BACKGROUND

In a data center or storage system, machine units (e.g., a server, a storage unit and/or the like) usually need to be held on a rack. However, existing holding devices usually have a poor performance and tend to be loose in transportation and/or shock and vibration test. In specific application, this might cause serious problems such as data loss and affect the performance of the data center or storage system.

SUMMARY

There are hereby provided a rod for use in a rack and a holding device for use in cooperation with the rack to solve the above problems and other potential problems existing in the field.

According to a first aspect of the present disclosure, there is provided a rod for use in a rack. The rod comprises: a first end provided with a bolt, the bolt having a trapezoidal thread, wherein when the rod is inserted into the rack through a target device, the bolt connects the first end to the rack such that the target device is secured to the rack.

In some embodiments, the rod comprises a second end which is provided with a manually rotatable handle. In this way, it is feasible to rotate the rod by manually rotating the handle, thereby securing the target device to the rack.

In some embodiments, the trapezoidal thread conforms to ACME thread specification which has a 29 degree thread angle between adjacent threads.

In some embodiments, the rod further comprises a stopper disposed at the first end for use in cooperation with the bolt.

According to a second aspect of the present disclosure, there is provided a holding device for use in cooperation with the rack. The holding device comprises: a nut having a trapezoidal thread to receive the rod and is adapted to be used in cooperation with the bolt at an end of the rod to secure the target device to the rack via the rod.

In some embodiments, the holding device is made of plastics.

In some embodiments, the holding device is integrally formed from plastics.

In some embodiments, the plastics comprise polycarbonate and acrylonitrile-butadiene-styrene copolymer or glass fiber reinforced polycarbonate.

In some embodiments, the trapezoidal thread conforms to ACME thread specification which has a 29 degree thread angle between adjacent threads.

According to a third aspect of the present disclosure, there is provided a rack comprising the holding device according to the second aspect.

With the trapezoidal thread, it is possible to secure the target device to the rack more firmly and enhance the shock-resistance performance, thereby avoiding data loss caused by mechanical factors. In addition, since the holding device may employ a plastic material, the shock-resistant performance can be further enhanced and the manufacturing costs may be reduced substantially while ensuring mechanical strength of the holding device.

BRIEF DESCRIPTION OF THE DRAWINGS

Through the following detailed description with reference to the accompanying drawings, the above and other objectives, features, and advantages of example embodiments of the present disclosure will become more apparent. Several example embodiments of the present disclosure will be illustrated by way of example but not limitation in the drawings in which.

DETAILED DESCRIPTION OF EMBODIMENTS

Principles of example embodiments disclosed herein will now be described with reference to various example embodiments illustrated in the drawings. It should be appreciated that description of those embodiments is merely to enable those skilled in the art to better understand and further implement example embodiments disclosed herein and is not intended for limiting the scope disclosed herein in any manner.

Figure 1:
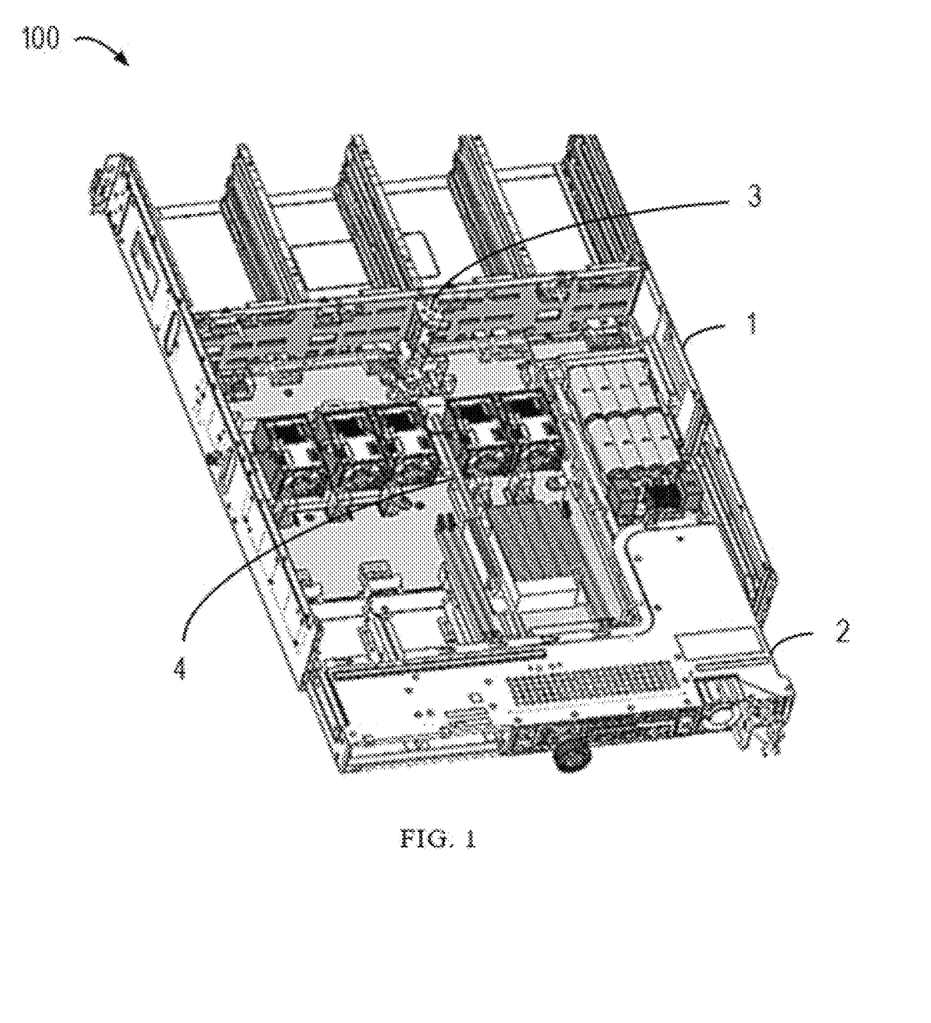
FIG. 1 is a diagram illustrating an application environment of an embodiment according to the present disclosure.

FIG. 1 is a diagram illustrating an application environment 100 of an embodiment according to the present disclosure. As shown in FIG. 1, a rack 1 is a common device for supporting or accommodating a machine unit 2 in a data center or storage system. The machine unit 2 for example may be a server, a storage unit or the like. Since the machine unit 2 needs to be mounted on the rack, the machine unit 2 may also be called a target device. When the machine unit 2 is mounted on the rack 1, a rod 4 is inserted through the machine unit 2 into the rack 1, thereby securing the machine unit 2 to the rack 1. The rack 1 may be mounted with a holding device 3 for use in cooperation therewith, and the holding device 3 may be used in cooperation with the rod 4 to hold the machine unit 2 on the rack 1 via the rod 4.

It should be appreciated that the embodiment of the present disclosure is described mainly in conjunction with the rack, but this is only exemplary and not limiting. It will be apparent from the following description that the device described herein is also adapted for other devices and environments.

Figure 2:
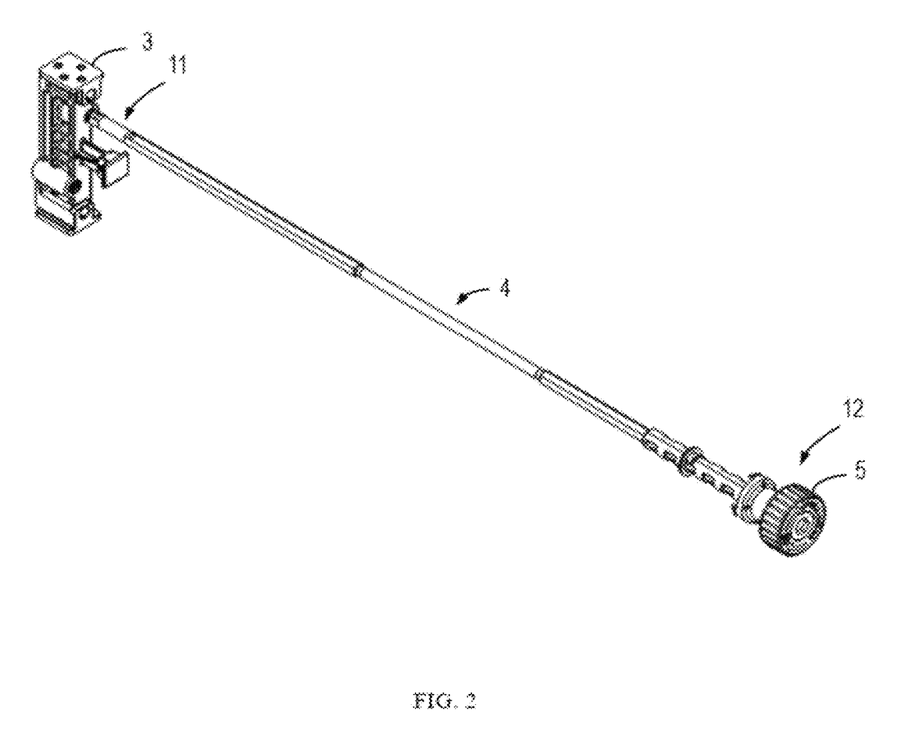
FIG. 2 is a schematic view of a rod and a corresponding holding device which are assembled together according to an embodiment of the present disclosure.
Figure 3:
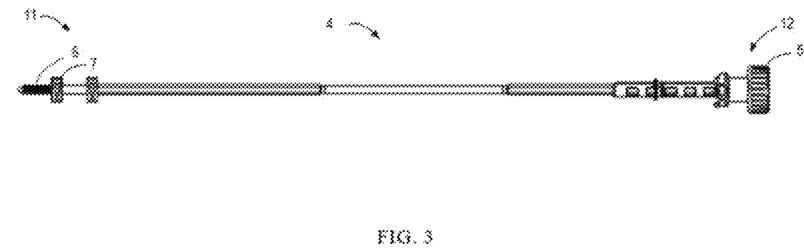
FIG. 3 is a schematic view of the rod of FIG. 2.
Figure 4:
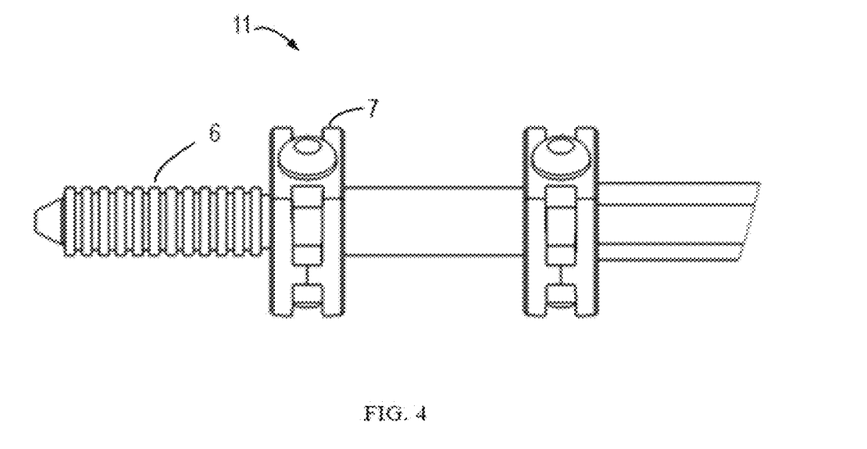
FIG. 4 is a schematic view of an end of the rod as shown in FIG. 3.

Now referring to FIGS. 2-4, the structure and operation principle of the holding device 3 and rod 4 are described in detail. For the sake of brevity, relevant devices such as the rack and machine unit are omitted in the figures. FIG. 2 is a schematic view of the rod 4 and the holding device 3 which are engaged together, and FIG. 3 shows the rod 4 alone. As shown in FIGS. 2-3, the rod 4 includes a first end 11 and a second end 12. The first end 11 will be shown in detail in FIG. 4.

The first end 11 of the rod 4 is provided with a bolt 6. When the rod 4 is inserted through the machine unit into the rack, the rod 6 connects the first end 11 to the rack, thereby securing the machine unit to the rack. To this end, as shown in FIG. 2, the holding device 3 comprises a nut which may be used in cooperation with the bolt 6 at the first end 11 of the rod 4 to secure the machine unit 2 onto the rack 1 via the rod 4.

In addition, as shown in FIGS. 3-4, in some embodiments, the rod 4 may further comprise a stopper 7 disposed at the first end 11 for use in cooperation with the bolt 6. Although the figure shows two stoppers, the number of the stoppers 7 may be one or more than two.

As shown in FIGS. 2-3, the rod 4 further comprises the second end 12 provided with a manually rotatable handle 5. With the aid of the handle 5, a mounting tool (e.g., a screw driver) would be unnecessary during the user's operation so that the user can conveniently install and detach the rod.

Figure 5A:
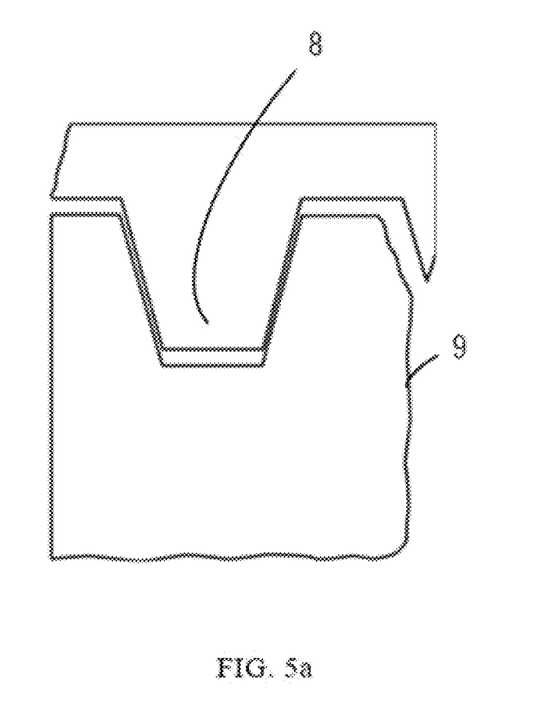
FIG. 5a is a schematic view of a thread according to an embodiment of the present disclosure.
Figure 5B:
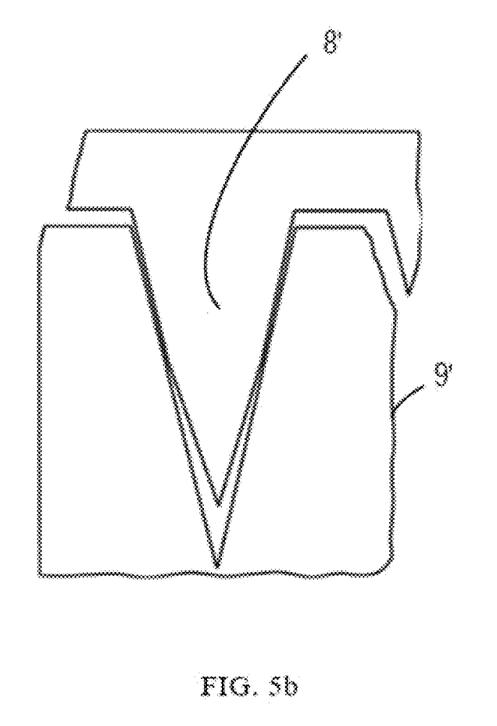
FIG. 5b is a schematic view of a prior art thread.

FIG. 5a shows a thread with a trapezoidal cross-sectional shape (also called thread form), namely, a trapezoidal thread according to an embodiment of the present disclosure. In contrast, FIG. 5b shows a thread with a triangular cross-sectional shape, namely, a triangular thread in the prior art. As shown in FIG. 5a, an external thread 8 and an internal thread 9 have corresponding trapezoidal threads. As shown in FIG. 5b, an external thread 8' and an internal thread 9' have corresponding triangular threads. The internal threads 9 and 9' may be used to secure the nut of the holding device 3, and external threads 8 and 8' may be used for the bolt of the rod 4. The Inventors fabricate the rod 4 and holding device 3 having two types of threads, and perform contrast test for them. It has already been proved during the transportation test and vibration test that the trapezoidal thread has a performance remarkably better than the triangular thread, and the machine unit is not easy to loosen, thereby substantially reducing possibility of data loss due to mechanical reasons. As compared with the triangular thread, the trapezoidal thread has more corners. That is, the triangular thread only includes one corner at the end, while the trapezoidal thread includes two corners on both sides of the end. This enables the trapezoidal thread to have a better shock-resistance performance than the triangular thread.

In some embodiments, the trapezoidal thread may conform to ACME thread specification which has a 29 degree thread angle between adjacent threads. As an example, the trapezoidal thread may be of 0.2500-16.0 ACME-3G specification. Certainly, this is only an example. The trapezoidal thread may be designed and manufactured according to any industry specification currently known or to be developed in the future.

In addition, in some embodiments, the holding device 3 may be made of plastics. Due to property differences of plastic and metallic materials, the holding device 3 made of plastics may achieve a better shock-resistance performance while ensuring mechanical strength. In addition, the holding device 3 made of plastics may substantially reduce the cost of manufacture, since the plastics have lower costs than metal.

In some embodiments, the holding device 3 may be integrally formed from plastics and thus it is easy to be assembled. As an example, the holding device may be formed by injection molding, and the plastics may be polycarbonate and acrylonitrile-butadiene-styrene copolymer (PC+ABS) or glass fiber reinforced polycarbonate (PC+ glass fiber).

The foregoing has illustrated the principle and spirit of the present disclosure in conjunction with several specific examples. The embodiments of the present disclosure may secure the machine unit to the rack more firmly and enhance the shock-resistance performance, thereby avoiding data loss caused by mechanical factors. In addition, since the holding device may employ a plastic material, the shock-resistant performance can be further enhanced and the manufacturing costs may be reduced substantially. It is appreciated that the above embodiments described in conjunction with figures are not mutually exclusive. Instead, features described in conjunction with these embodiments may be arbitrarily arranged and combined as required. The scope of the present disclosure is not limited in this aspect.

Although the present disclosure has been described with reference to various embodiments, it should be understood that the present disclosure is not limited to the disclosed embodiments. The present disclosure is intended to cover various modifications and equivalent arrangements included in the spirit and scope of the appended claims. The scope of the appended claims meets the broadest explanations and covers all such modifications and equivalent structures.

We claim:

1. Electronic equipment for a data center or storage system, comprising:
   an electronic hardware rack having a set of walls, a bottom surface, and a generally rectangular holding device, the set of walls defining an interior space therebetween, the holding device being disposed at a fixed position within the interior space and including a nut having trapezoidal threading;
   a machine unit that mounts to the electronic hardware rack within the interior space; and
   a rod assembly including a bolt at a first end of the rod assembly, a handle portion at a second end of the rod assembly that is opposite the first end, and an elongated mid-section that extends between the bolt portion and the handle portion, the bolt having trapezoidal threading, wherein the rod assembly extends through the machine unit and the bolt is received within the holding device to secure the machine unit to the electronic hardware rack with the machine unit residing within the interior space and enhance shock resistance performance; wherein the bolt having the trapezoidal threading engages with the nut having the trapezoidal threading in response to rotation of the handle portion.

2. Electronic equipment as in claim 1, wherein the machine unit includes a body defining a set of edges configured to engage with the set of walls of the electronic hardware rack; and wherein the rod assembly passes through a mid-section of the body between the set of edges.

3. Electronic equipment as in claim 1, wherein the set of walls of the electronic hardware rack includes a left wall and a right wall that define the interior space;
   wherein the body of the machine unit defines a left edge and a right edge; and
   wherein the left edge and right edge defined by the body of the machine unit are configured to slidably engage the left wall and the right wall respectively.

4. Electronic equipment as in claim 3, wherein the left wall and the right wall define a width of the interior space, the width being larger than a height of the left wall and the right wall respectively.

5. Electronic equipment as in claim 3, wherein the trapezoidal threading of the nut has a 29 degree thread angle between adjacent threads.

6. Electronic equipment as in claim 3, wherein the holding device is made of plastics.

7. Electronic equipment as in claim 6, wherein the holding device is integrally formed from plastics.

8. Electronic equipment as in claim 6, wherein the plastics comprise polycarbonate and acrylonitrile-butadiene-styrene copolymer or glass fiber reinforced polycarbonate.

9. Electronic equipment as in claim 3, wherein the trapezoidal threading of the bolt has a 29 degree thread angle between adjacent threads.

* * * * *